(12) United States Patent
Nguyen

(10) Patent No.: US 7,139,361 B1
(45) Date of Patent: Nov. 21, 2006

(54) COUNTER-BASED DIGITAL FREQUENCY SYNTHESIZER CIRCUITS AND METHODS

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 37 days.

(21) Appl. No.: 11/058,043

(22) Filed: Feb. 15, 2005

Related U.S. Application Data

(63) Continuation-in-part of application No. 10/651,811, filed on Aug. 29, 2003, now Pat. No. 6,906,562, which is a continuation-in-part of application No. 10/618,329, filed on Jul. 11, 2003, now Pat. No. 7,005,900.

(51) Int. Cl.
*H03K 21/00* (2006.01)
*H03K 23/00* (2006.01)

(52) U.S. Cl. ................ 377/47; 327/107; 327/299
(58) Field of Classification Search ............. None
See application file for complete search history.

(56) References Cited

U.S. PATENT DOCUMENTS

| | | | |
|---|---|---|---|
| 3,952,253 A | 4/1976 | DeVolpi et al. | |
| 4,017,719 A | 4/1977 | Kaplan et al. | |
| 4,027,261 A * | 5/1977 | Laurent et al. | ............... 327/98 |
| 4,290,022 A | 9/1981 | Puckette | |
| 5,109,395 A | 4/1992 | Tanaka | |
| 5,744,992 A | 4/1998 | Baumann | |
| 5,898,329 A | 4/1999 | Hopkins | |
| 6,023,199 A | 2/2000 | Cheung | |
| 6,127,859 A * | 10/2000 | Lim | ............... 327/105 |
| 6,259,283 B1 | 7/2001 | Nguyen | |
| 6,285,226 B1 | 9/2001 | Nguyen | |
| 6,351,168 B1 * | 2/2002 | Li et al. | ............... 327/160 |
| 6,351,756 B1 | 2/2002 | Taniyoshi | |
| 6,426,660 B1 | 7/2002 | Ho et al. | |
| 6,788,120 B1 | 9/2004 | Nguyen | |
| 6,906,562 B1 | 6/2005 | Nguyen | |
| 6,906,571 B1 | 6/2005 | Nguyen | |
| 6,924,684 B1 | 8/2005 | Nguyen | |
| 7,005,900 B1 | 2/2006 | Nguyen | |

* cited by examiner

*Primary Examiner*—Tuan T. Lam
(74) *Attorney, Agent, or Firm*—Lois D. Cartier

(57) ABSTRACT

Digital frequency synthesizer (DFS) circuits and methods use counters to define the positions of the output clock edges. A clock divider divides an input clock by a positive integer to provide a divided clock. A first counter circuit counts for one divided clock period, and the count is provided to a timing circuit that generates two or more sets of intermediate values. Each set represents a set of intermediate points within a period of the divided clock. Based on a specified multiplication value, one set of intermediate values is selected. Utilizing the divided clock, the selected set of intermediate values, and a second counter running at the same frequency as the first counter circuit, an output clock generator provides an output clock having an initial pulse at the beginning of each divided clock period, and a subsequent pulse at intermediate points represented by the selected set of intermediate values.

20 Claims, 10 Drawing Sheets

US 7,139,361 B1

COUNTER-BASED DIGITAL FREQUENCY SYNTHESIZER CIRCUITS AND METHODS

CROSS-REFERENCE TO RELATED APPLICATIONS

This application is a continuation-in-part of commonly assigned application Ser. No. 10/651,811, by Andy T. Nguyen, entitled "Counter-Based Clock Multiplier Circuits and Methods" and filed Aug. 29, 2003 now U.S. Pat. No. 6,906,562, which is a continuation-in-part of commonly assigned application Ser. No. 10/618,329, by Andy T. Nguyen, entitled "Counter-Based Clock Doubler Circuits and Methods with Optional Duty Cycle Correction and Offset" and filed Jul. 11, 2003 now U.S. Pat. No. 7,005,900, both of which applications are incorporated herein by reference.

FIELD OF THE INVENTION

The invention relates to digital frequency synthesizer (DFS) circuits for clocked systems. More particularly, the invention relates to a counter-based DFS circuit optionally having a programmable relationship between the frequencies of the input and output clock signals.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g., DLLs, RAM, and so forth).

The CLBs, IOBs, interconnect, and other logic blocks are typically programmed by loading a stream of configuration data (bitstream) into internal configuration memory cells that define how the CLBs, IOBs, and interconnect are configured. The configuration data can be read from memory (e.g., an external PROM) or written into the FPGA by an external device. The collective states of the individual memory cells then determine the function of the FPGA.

FIG. 1 is a simplified illustration of an exemplary FPGA. The FPGA of FIG. 1 includes an array of configurable logic blocks (LBs 101a–101i) and programmable input/output blocks (I/Os 102a–102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. As noted above, some FPGAs also include additional logic blocks with special purposes (not shown), e.g., DLLs, block RAM, and so forth.

Another type of PLD is the Complex Programmable Logic Device, or CPLD. FIG. 2 is a simplified illustration of an exemplary CPLD. A CPLD typically includes two or more logic blocks (LBs 201a–201h) connected together and to input/output blocks (I/Os 202a–202f) by a programmable interconnection array (203). Each logic block of the CPLD includes a two-level AND/OR structure similar to those used in Programmable Logic Arrays (PLAs) and Programmable Array Logic (PAL) devices. The interconnection array includes many multiplexer circuits 205, each including several PIPs 204. In each multiplexer circuit 205, only one PIP 204 is enabled. The enabled PIP selects one of the many input signals provided to the interconnection array, and the selected input signal is provided as the output signal from the multiplexer circuit 205.

In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static RAM cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as ASIC devices (Application Specific Integrated Circuits). PLDs can also be implemented in other ways, e.g., using fuse or antifuse technology.

Whatever type of architecture is used, PLDs generally include many programmable logic blocks of various types interconnected by a programmable interconnect structure. Other circuits included in the PLD might or might not be programmable. These additional circuits can include, for example, configuration logic and a clock distribution structure.

Clock signals are used in virtually every IC and electronic system to control timing. PLDs are no exception. For example, every time a rising edge occurs on a clock signal, all the flip-flops in a circuit might change state. Clearly, the higher the frequency of the clock signal, the faster the circuit operates. Therefore, where performance is an issue, circuit designers usually prefer to use the fastest available clock that can be supported by the delays on the logic paths through the circuit. In other words, the performance of a circuit is typically limited by the logic delays on the slowest logic path. However, sometimes the longest path delay through the circuit is significantly shorter than the period of the available clock, and the frequency of the available clock becomes the limiting factor.

To overcome this limitation, circuit designers can increase (e.g., double or quadruple) the frequency of a clock signal using a phase-lock loop (PLL) or delay-lock loop (DLL) circuit. However, PLLs are analog in nature and take a long time to simulate, and a design that works in one manufacturing process may stop working when manufactured using another process. Therefore, PLLs are very difficult to design, and often are not feasible in a given circuit or system. DLLs can also be very complicated and difficult to design. Additionally, DLLs typically consume a great deal of silicon area. Therefore, clock frequency multiplication is often not feasible using known circuits and methods.

Therefore, it is desirable to provide circuits and methods that enable a circuit designer to increase the frequency of an input clock without using a PLL or DLL, using a fairly simple circuit that consumes a relatively small amount of silicon area. It is further desirable to be able to implement such circuits and methods using the logic resources included in a programmable logic device (PLD) when desired. When implemented in a PLD, it is further desirable to optionally provide a programmable multiplication factor between the input and output clock frequencies.

SUMMARY OF THE INVENTION

The invention provides novel digital frequency synthesizer (DFS) circuits and methods that use counters to define the positions of the output clock edges. The DFS circuits of the invention accept an input clock signal having a first frequency and provide an output clock signal having a second frequency M/D (M divided by D) times the first frequency, where M and D are positive integers. In a DFS circuit according to one embodiment of the invention, an input clock signal having a frequency F is divided by a positive integer D to provide a divided clock signal having a frequency of F/D. A first counter circuit is periodically enabled to count for one period of the divided clock signal, and the counted value is stored in a register. Thus, the stored value represents the number of counts in one divided clock period, and is approximately equal to 1/D times the number of counts in one input clock period.

The stored value is then provided to a timing circuit that generates two or more sets of intermediate values. Each set of intermediate values represents a set of intermediate points within a period of the divided clock signal. For example, one set of intermediate values might indicate points 1/5, 2/5, 3/5, and 4/5 of the way through one period of the divided clock signal.

Based on a pre-selected multiplication value M, one of the sets of intermediate values from the timing circuit is selected. For example, when M=5, the set of intermediate values 1/5, 2/5, 3/5, and 4/5 is selected. Utilizing the divided clock signal, the selected set of intermediate values, and a second counter running at the same frequency as the first counter circuit, an output clock generator provides an output clock signal having an initial pulse at the beginning of each period of the divided clock signal, and a subsequent pulse at the intermediate points represented by the selected set of intermediate values. Thus, the frequency of the output clock signal is F×M/D (F times M divided by D).

In some embodiments, the values of M and/or D are programmable. For example, when the DFS circuit is included in a programmable logic device (PLD), the values of M and/or D can be stored in configuration memory cells of the PLD, or can be decoded from values stored in configuration memory cells of the PLD. In other embodiments, one or both of M and D have fixed values.

Other embodiments of the invention provide related structures and methods of providing an output clock signal having a frequency of M/D times the input clock frequency.

BRIEF DESCRIPTION OF THE DRAWINGS

The present invention is illustrated by way of example, and not by way of limitation, in the following figures.

DETAILED DESCRIPTION OF THE DRAWINGS

Figure 1:
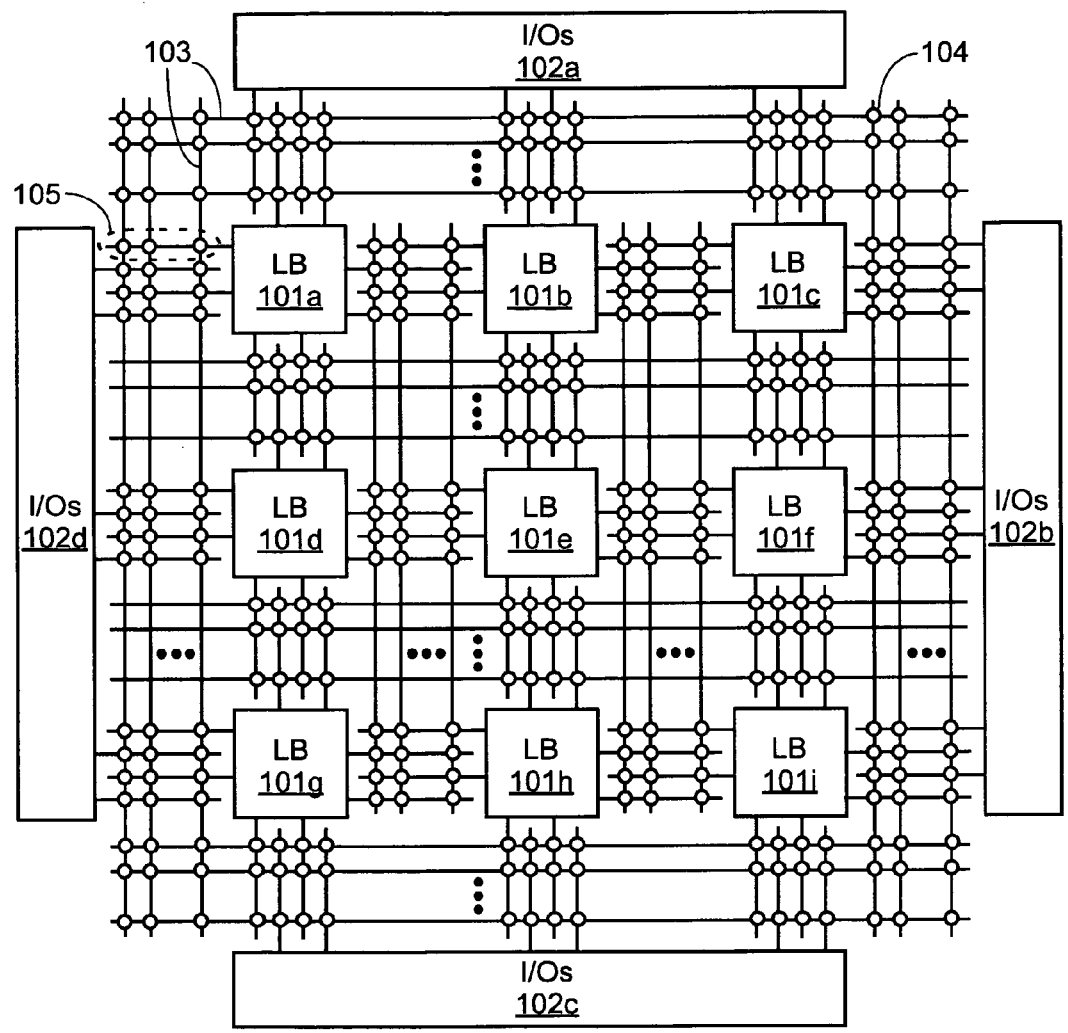
FIG. 1 illustrates an exemplary field programmable gate array (FPGA).
Figure 2:
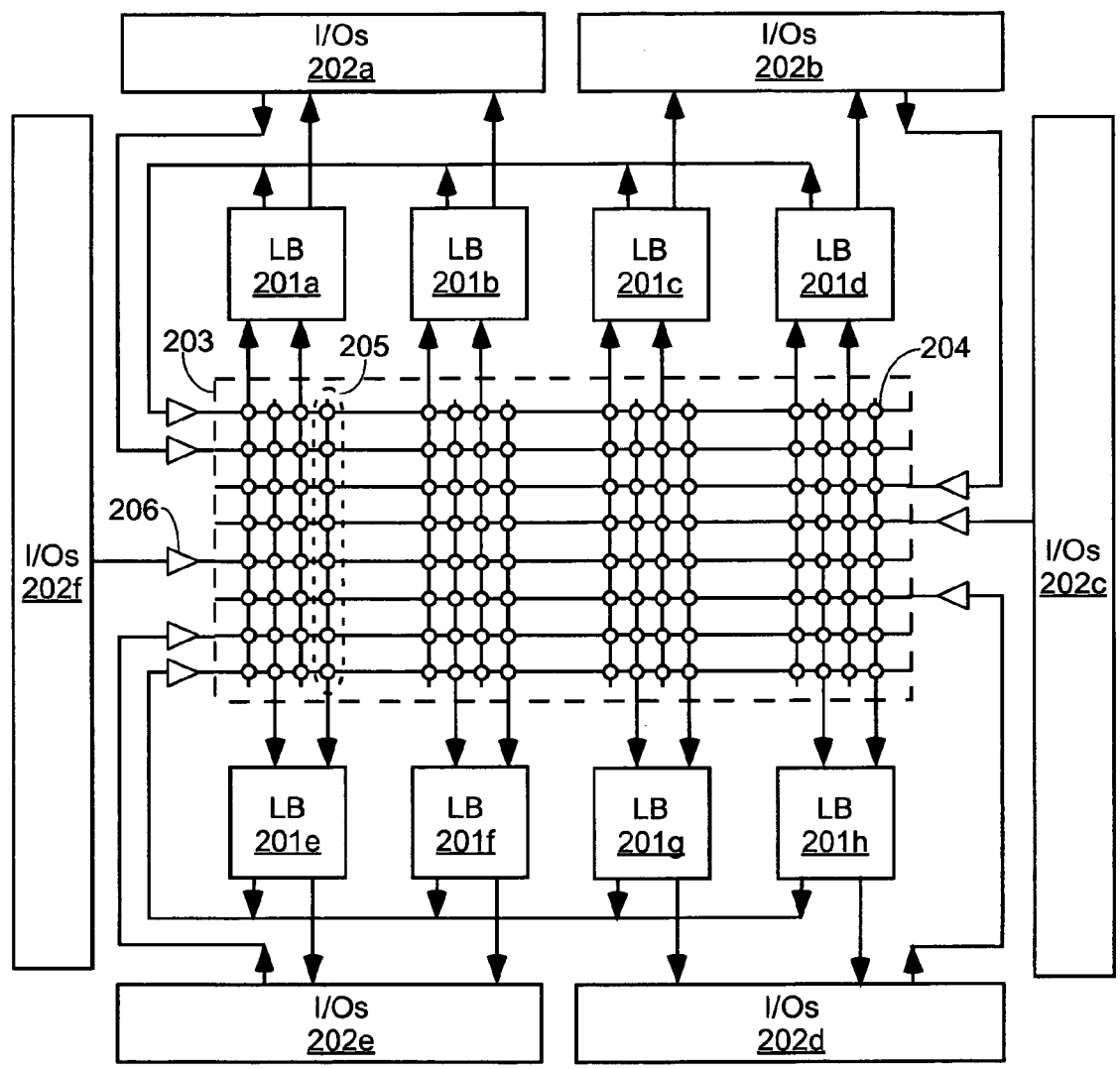
FIG. 2 illustrates an exemplary Complex Programmable Logic Device (CPLD).
Figure 3:
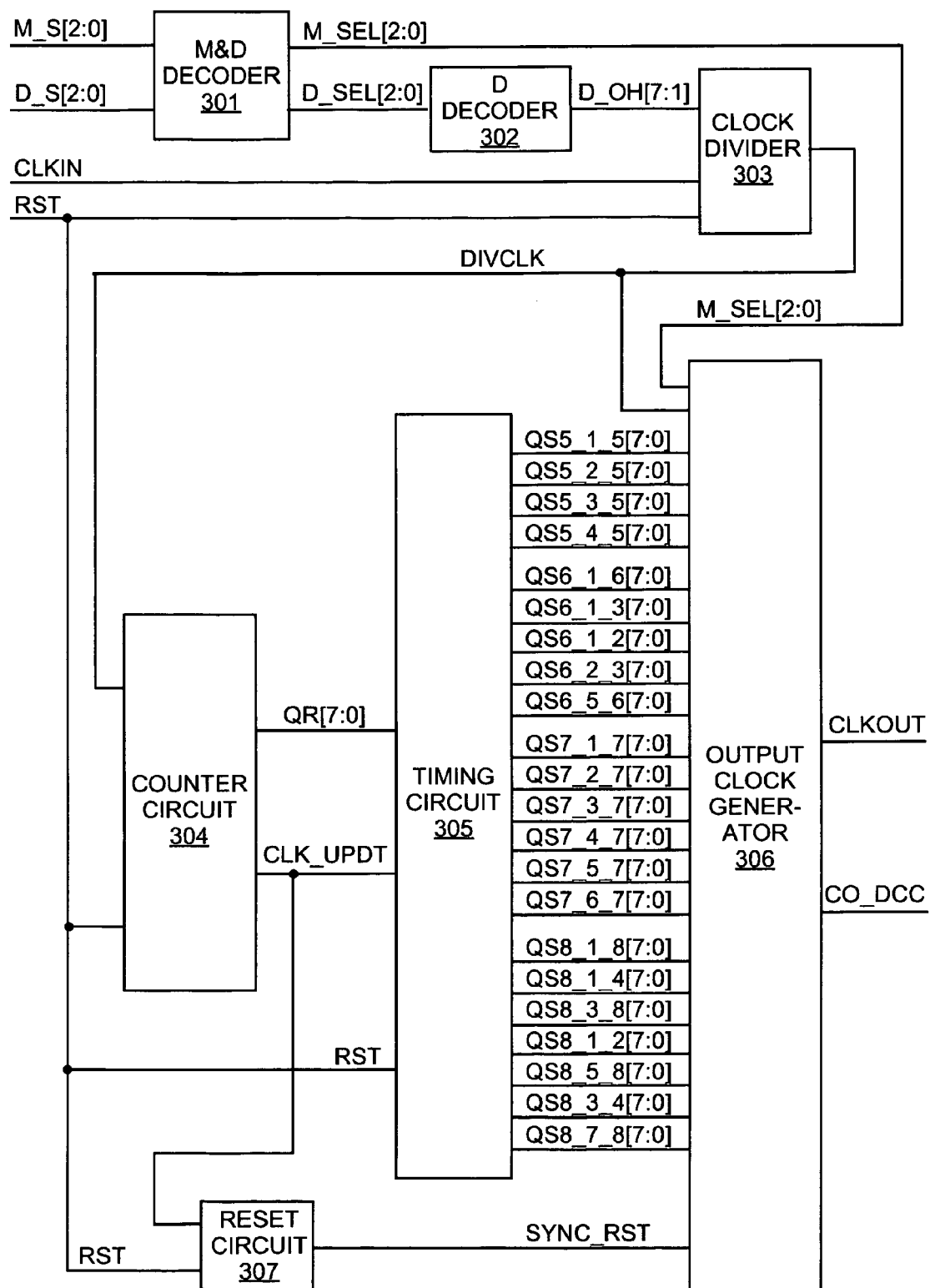
FIG. 3 illustrates a digital frequency synthesizer (DFS) circuit according to an embodiment of the invention.

FIG. 3 illustrates a digital frequency synthesizer (DFS) circuit according to an embodiment of the invention. The DFS circuit of FIG. 3 includes an optional M&D decoder 301, an optional D decoder 302, a clock divider circuit 303, a counter circuit 304, a timing circuit 305, an output clock generator 306, and an optional reset circuit 307, coupled together as shown in FIG. 3.

Note that the DFS circuit of FIGS. 3–10 utilizes 8-bit counters and can accommodate values of M and D between one and eight, inclusive. However, this value range is a matter of design choice. Smaller or larger values of M and D can be supported. In some embodiments, the maximum values of M and D are both the same. In other embodiments (not shown), the maximum values are different from one another.

In some embodiments, the DFS circuit of FIGS. 3–10 is implemented in a programmable logic device (PLD). In these embodiments, the values M_S[2:0] and D_S[2:0] can optionally be stored in memory within the PLD. In some embodiments, the values of M_S[2:0] and D_S[2:0] are stored in configuration memory cells of the PLD.

M&D decoder 301 is an optional circuit that decodes the values of M (the multiplication factor for the output frequency) and D (the divisor for the output frequency) from provided values to ensure that M and D have no common divisors other than one. For example, if M=4 and is provided in the form of M_S[2:0]=100, and D=8 and is provided in the form of D_S[2:0]=000, M&D decoder 301 provides the select values M_SEL[2:0]=001 (M=1) and D_SEL[2:0]=010 (D=2). If M=6 and is provided in the form of M_S[2:0]=110, and D=4 and is provided in the form of D_S[2:0]=100, M&D decoder 301 provides the select values M_SEL[2:0]=011 (M=3) and D_SEL[2:0]=010 (D=2). Table 1 illustrates the input and output values for an exemplary embodiment of M&D decoder 301. The decoder of Table 1 can be easily implemented using any well-known implementation, as will be clear to those of skill in the relevant arts.

Note that this decoder can be omitted from the embodiment of FIG. 3, if the user is required to provide only values of M_S[2:0] and D_S[2:0] that already have no common divisors other than one.

TABLE 1

| | | M | | | | | | | |
|---|---|---|---|---|---|---|---|---|---|
| | M/D | 1 | 2 | 3 | 4 | 5 | 6 | 7 | 8 |
| D | 1 | 1 | 2 | 3 | 4 | 5 | 6 | 7 | 8 |
| | 2 | 1/2 | 1 | 3/2 | 2 | 5/2 | 3 | 7/2 | 4 |
| | 3 | 1/3 | 2/3 | 1 | 4/3 | 5/3 | 2 | 7/3 | 8/3 |

TABLE 1-continued

| M/D | M | | | | | | | |
|---|---|---|---|---|---|---|---|---|
| | 1 | 2 | 3 | 4 | 5 | 6 | 7 | 8 |
| 4 | 1/4 | 1/2 | 3/4 | 1 | 5/4 | 3/2 | 7/4 | 2 |
| 5 | 1/5 | 2/5 | 3/5 | 4/5 | 1 | 6/5 | 7/5 | 8/5 |
| 6 | 1/6 | 1/3 | 1/2 | 2/3 | 5/6 | 1 | 7/6 | 4/3 |
| 7 | 1/7 | 2/7 | 3/7 | 4/7 | 5/7 | 6/7 | 1 | 8/7 |
| 8 | 1/8 | 1/4 | 3/8 | 1/2 | 5/8 | 3/4 | 7/8 | 1 |

D decoder 302 is an optional circuit that decodes the value of D_SEL[2:0] from the M&D decoder 301 (or from provided values if M&D decoder 301 is omitted) to provide a "modified one-hot" encoded value for D. For example, if D=7 and is provided in the form of D_SEL[2:0]=111, D decoder 302 provides the decoded value of D_OH[7:1]= 1000000. If D=2 and is provided in the form of D_SEL[2:0]=010, D decoder 302 provides the decoded value of D_OH[7:1]=0000010. However, if D=8 and is provided in the form of D_SEL[2:0]=000, all of the output signals D_OH[7:1] are low. Table 2 illustrates the input and output values for an exemplary embodiment of D decoder 302. The decoder of Table 2 can be easily implemented using any well-known implementation, as will be clear to those of skill in the relevant arts.

Note that in this embodiment, the value D=8 is encoded as "000", D=7 is encoded as 111, D=6 is encoded as 110, and so forth. Clearly, the value of D=0 is not supported, because division by zero is not supported.

Note that this decoder can be omitted from the embodiment of FIG. 3, if the user is required to provide only values of D that are already encoded according to the requirements of the clock divider circuit. Additionally, some embodiments of the invention (not shown) do not require D decoder 302, or use decoder circuits other than the exemplary circuit shown, because the modified one-hot encoding is not required for the input value of D.

TABLE 2

| D_SEL[2:0] | | | D_OH[7:1] | | | | | | |
|---|---|---|---|---|---|---|---|---|---|
| [2] | [1] | [0] | [7] | [6] | [5] | [4] | [3] | [2] | [1] |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 0 |
| 0 | 1 | 1 | 0 | 0 | 0 | 0 | 1 | 0 | 0 |
| 1 | 0 | 0 | 0 | 0 | 0 | 1 | 0 | 0 | 0 |
| 1 | 0 | 1 | 0 | 0 | 1 | 0 | 0 | 0 | 0 |
| 1 | 1 | 0 | 0 | 1 | 0 | 0 | 0 | 0 | 0 |
| 1 | 1 | 1 | 1 | 0 | 0 | 0 | 0 | 0 | 0 |

Figure 4:
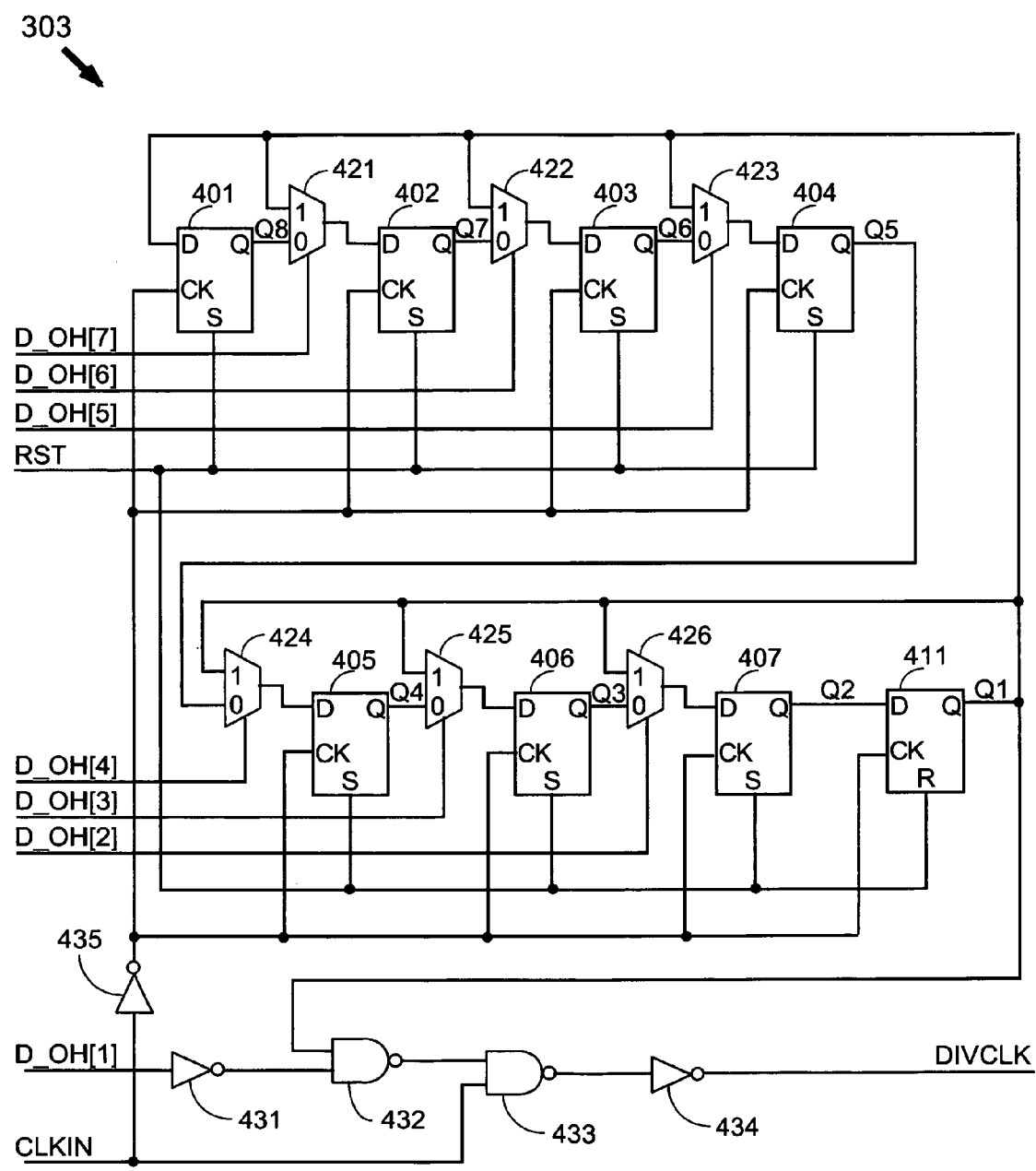
FIG. 4 illustrates a clock divider circuit that can be used, for example, in the embodiment of FIG. 3.

FIG. 4 illustrates one embodiment of clock divider circuit 303 that can be used, for example, in the DFS circuit of FIG. 3. The clock divider circuit of FIG. 4 includes seven set flip-flops 401–407 and one reset flip-flop 411, coupled in series as shown in FIG. 4. Each flip-flop is clocked by the inverse of input clock signal CLKIN and is set or reset by reset signal RST. Between each pair of the set flip-flops is a 2-to-1 multiplexer 421–426, coupled to select either signal Q1 (provided by reset flip-flop 411) or the output signal Q8–Q3 from the previous set flip-flop 401–406 to be provided to the data input D of the associated destination flip-flop 402–407. Each of these multiplexers is controlled by one of the modified one-hot signals D_OH[7:2] from D decoder 302. Thus, signals D_OH[7:2] control the size of a loop of flip-flops fed by reset flip-flop 411 and clocked by the inverse of input clock signal CLKIN. This loop provides an output signal Q1, which is low for one period of input clock signal CLKIN with a frequency controlled by signals D_OH[7:2]. For example, if signal D_OH[3] is high, signal Q1 is low for one input clock period out of every three. As another example, if all of signals D_OH[7:1] are low, signal Q1 is low for one input clock period out of every eight.

If signal D_OH[1] is low, the desired divisor is eight. If signal D_OH[1] is high, the desired divisor is one, and the output signal should be the same as input clock signal CLKIN. This selection is accomplished by the circuitry shown at the bottom of FIG. 4. Signal Q1 is combined with the inverse of signal D_OH[1] (inverted by inverter 431) in NAND gate 432. NAND gate 432 and input clock signal CLKIN drive NAND gate 433, which in turn drives inverter 434 to provided a divided clock signal DIVCLK. Thus, when signal D_OH[1] is high, input clock signal CLKIN is simply inverted twice (by NAND gate 433 and inverter 434) and passed to the output terminal DIVCLK. (In the present specification, the same reference characters are used to refer to terminals, signal lines, and their corresponding signals.) When signal D_OH[1] is low, signal Q1 and input clock signal CLKIN are combined to ensure that the divided clock signal DIVCLK is high during the CLKIN high pulse during one out of every eight input clock periods.

Figure 5:
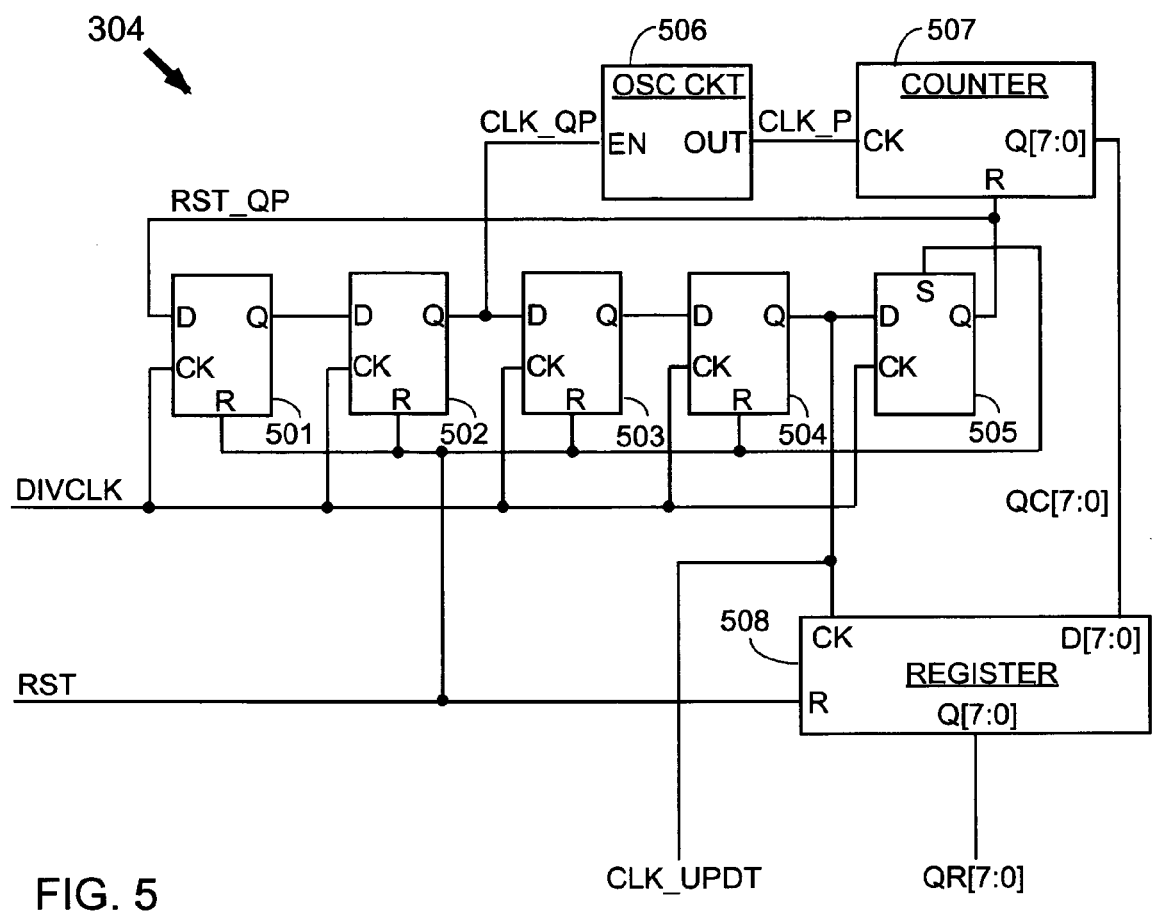
FIG. 5 illustrates a counter circuit that can be used, for example, in the embodiment of FIG. 3.

FIG. 5 illustrates an embodiment of counter circuit 304 that can be used, for example, in the DFS circuit of FIG. 3. The counter circuit of FIG. 5 includes a counter 507 that utilizes a relatively faster clock signal CLK_P generated by an oscillator circuit 506 to count a number of counts QC[7:0] in one period of divided clock signal DIVCLK. The number of counts QC[7:0] is stored in register 508, which provides a registered count QR[7:0] to timing circuit 305 (see FIG. 3).

In the pictured embodiment, counter circuit 304 is designed to recount the length of the divided clock pulse (i.e., to generate a new value of QR[7:0]) every fifth clock cycle. In other embodiments, the periodicity of the count has other values, e.g., the desired periodicity can be selected based on the stability of the divided clock frequency. In other embodiments, other implementations of counter circuit 304 are used. Any appropriate embodiment can be used.

In the pictured embodiment, counter circuit 304 includes reset flip-flops 501–504 and set flip-flop 505. Flip-flops 501–505 are coupled in series, and serve to provide three non-overlapping clock pulses in the following repeating sequence: RST_QP, CLK_QP, and CLK_UPDT. Each of these signals is high for only one DIVCLK clock cycle.

Initially, signal RST_OP is high, because flip-flop 505 is a set flip-flop, and counter 507 is reset. The first rising edge of signal DIVCLK brings signal RST_OP low. On the second rising edge of signal DIVCLK, signal CLK_QP provides a high value on oscillator enable signal EN to oscillator circuit 506. Thus, oscillator enable signal EN is high for one out of every five input clock cycles. Oscillator circuit 506 generates a relatively fast oscillator output signal OUT (i.e., faster than divided clock signal DIVCLK) whenever signal EN is high. The oscillator output signal CLK_P is used by counter 507 to measure the divided clock period. Thus, in the pictured embodiment counter 507 performs the counting process only during one out of each five periods of the divided clock. On the fourth rising edge of signal DIVCLK, signal CLK_UPDT goes high. On the fifth rising edge of signal DIVCLK, signal RST_QP goes high again, resetting counter 507. The cycle then repeats each five clock cycles.

Note that the number of flip-flops coupled in series in counter circuit 304 determines the frequency with which the length of the divided clock period is determined. For example, in the embodiment of FIG. 5, the period is measured every five clock cycles. By adding another reset flip-flop to the chain (e.g., in front of set flip-flop 505), the period would be measured every six clock cycles, and so forth. It will be clear to one of skill in the relevant arts that this selection is a matter of design choice.

Figure 6:
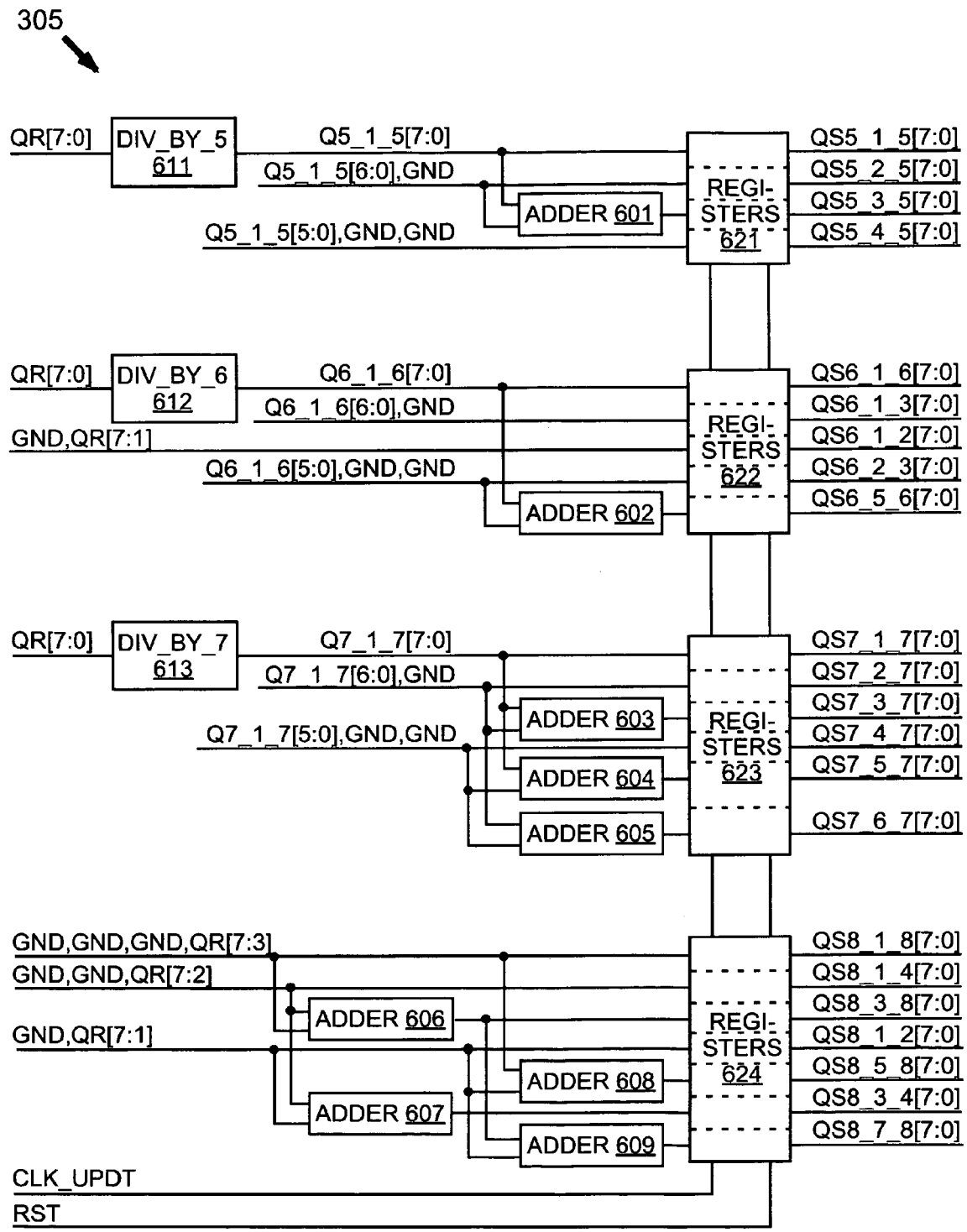
FIG. 6 illustrates a timing circuit that can be used, for example, in the embodiment of FIG. 3.

FIG. 6 illustrates an embodiment of timing circuit 305 that can be used, for example, in the DFS circuit of FIG. 3. In the pictured embodiment, timing circuit 305 generates four sets of intermediate values based on the number of counts QR[7:0]. Each set of intermediate values represents a set of intermediate points within a period of the divided clock signal. A first set of intermediate values QS5_x_y[7:0] indicates points 1/5, 2/5, 3/5, and 4/5 of the way through one period of the divided clock signal. A second set of intermediate values QS6_x_y[7:0] indicates points 1/6, 1/3, 1/2, 2/3, and 5/6 of the way through one period of the divided clock signal. A third set of intermediate values QS7_x_y[7:0] indicates points 1/7, 2/7, 3/7, 4/7, 5/7, and 6/7 of the way through one period of the divided clock signal. A fourth set of intermediate values QS8_x_y[7:0] indicates points 1/8, 1/4, 3/8, 1/2, 5/8, 3/4, and 7/8 of the way through one period of the divided clock signal.

In some embodiments, the intermediate points represented by each set of intermediate values divide the period of the divided clock signal into exactly equal divisions. However, the clock signal used to count the length of the divided clock period itself has a finite period, and so the division has a finite resolution. Hence, in most embodiments of the invention the period of the divided clock signal is divided into only approximately equal divisions, i.e., with an accuracy limited by the resolution of the circuit.

The timing circuit of FIG. 6 includes divider circuits 611–613, adders 601–609, and registers 621–624, coupled together as shown in FIG. 6. The functionality of the timing circuit will be clear to those of skill in the relevant arts. However, the derivation of the second set of intermediate values is now described, to provide an example of how these intermediate values can be derived. Clearly, other circuits and methods can be used to derive the intermediate points of the divided clock period.

The point 1/6 of the way through the divided clock period is derived by simply dividing the registered count value QR[7:0] by six. This can be accomplished using any of several well-known divider circuits (DIV_BY_6, 612). For example, a lookup table can be used, or the divisor can simply be subtracted until the remainder is less than the divisor. In some embodiments, the DFS circuit is implemented in a programmable logic device (PLD) that includes specialized arithmetic and/or digital signal processing (DSP) circuitry. In these embodiments, the arithmetic and/or DSP circuitry can be used to implement the divider circuits. The resulting value Q6_1_6[7:0] is stored in a register 622 to provide Q-stop value QS6_1_6[7:0].

The point 1/3 of the way through the divided clock period is derived from the 1/6 value Q6_1_6[7:0] by multiplying by two, e.g., by shifting the value one place to the left and adding a zero as the least significant bit (Q6_1_6[6:0], GND). The resulting value is stored in register 622 to provide O-stop value QS6_1_3[7:0].

The point 1/2 of the way through the divided clock period is derived from the registered count value QR[7:0] by dividing by two, e.g., by shifting the value one place to the right and adding a zero as the most significant bit (GND, QR[7:1]). The resulting value is stored in register 622 to provide Q-stop value QS6_1_2[7:0].

The point 2/3 of the way through the divided clock period is derived from the 1/6 value Q6_1_6[7:0] by multiplying by four, e.g., by shifting the value two places to the left and adding two zeroes as the least significant bits (Q6_1_6[5:0], GND, GND). The resulting value is stored in register 622 to provide Q-stop value QS6_2_3[7:0].

The point 5/6 of the way through the divided clock period is derived by adding the 2/3 value (Q6_1_6[5:0], GND, GND) and the 1/6 value Q6_1_6[7:0] in adder 602. This addition step can be accomplished using any well-known adder circuit. The resulting value is stored in register 622 to provide Q-stop value QS6_5_6[7:0].

Figure 7:
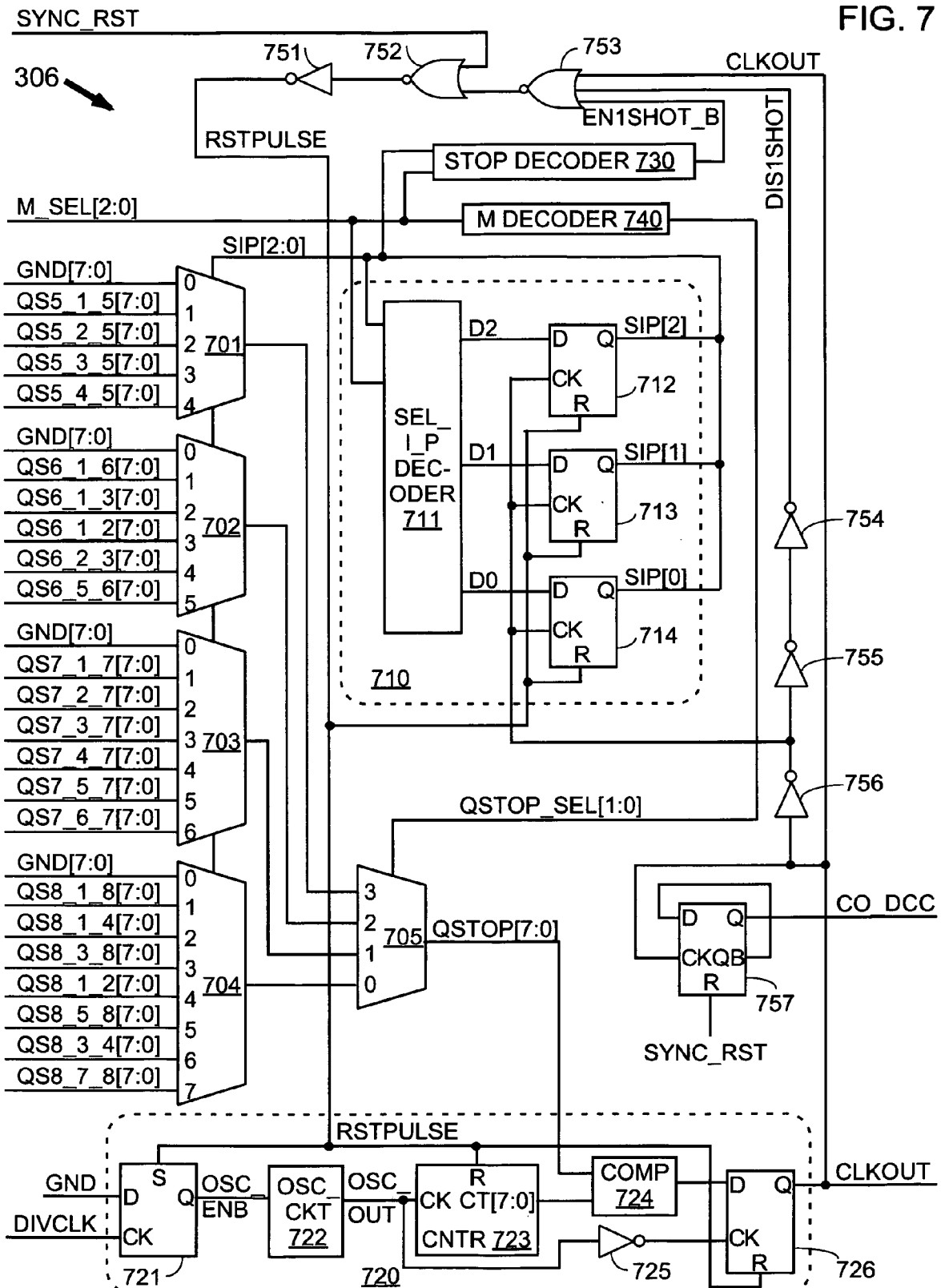
FIG. 7 illustrates an output clock generator that can be used, for example, in the embodiment of FIG. 3.

FIG. 7 illustrates an embodiment of output clock generator 306 that can be used, for example, in the DFS circuit of FIG. 3. In the circuit of FIG. 7, one of the sets of intermediate values from the timing circuit is selected, based on the value of M. For example, if M=5, the first set of intermediate values QS5_x_y[7:0] is selected. The divided clock signal DIVCLK is then multiplied by the value M to provide an output clock signal CLKOUT having a frequency of F×M/D, where F is the frequency of the input clock signal CLKIN (see FIG. 3). To perform this multiplication of the divided clock signal, an initial pulse is provided on the output clock signal CLKOUT at the beginning of each period of the divided clock signal DIVCLK. During each DIVCLK clock period, a subsequent pulse is provided on the output clock signal CLKOUT at each intermediate point represented by the selected set of intermediate values. For example, when M=5, a pulse is provided at the 1/5, 2/5, 3/5, and 4/5 points of each DIVCLK period. Thus, the frequency of the output clock signal CLKOUT is M times the frequency of the divided clock DIVCLK.

In the pictured embodiment, output clock generator 306 includes a counter circuit 710, multiplexers 701–705, a clock generator circuit 720, inverters 751 and 754–756, NOR gates 752–753, stop decoder 730, M decoder 740, and flip-flop 757, coupled together as shown in FIG. 7.

The selection of one set of intermediate values is done by multiplexer 705 under the control of M decoder 740. M decoder 740 decodes the value of M_SEL[2:0] to select the output of one of multiplexers 701–704. Whichever of multiplexers 701–704 is selected cycles through the available intermediate values under the control of counter circuit 710, generating pulses at the appropriate intermediate points of the divided clock cycle. Note that in the pictured embodiment, depending on the value of M, counter circuit 710 does not necessarily include every intermediate point in the cycle. For example, when M=4, multiplexer 704 is used. However, when M=4, pulses are not wanted at the 1/8, 3/8, 5/8, and 7/8 points in the divided clock cycle. Therefore, counter circuit 710 causes multiplexer 704 to cycle through only the starting point (GND[7:0]) and the 1/4, 1/2, and 3/4 points of the divided clock cycle (e.g., the 0, 2, 4, and 6 input values of multiplexer 704).

Figure 8:
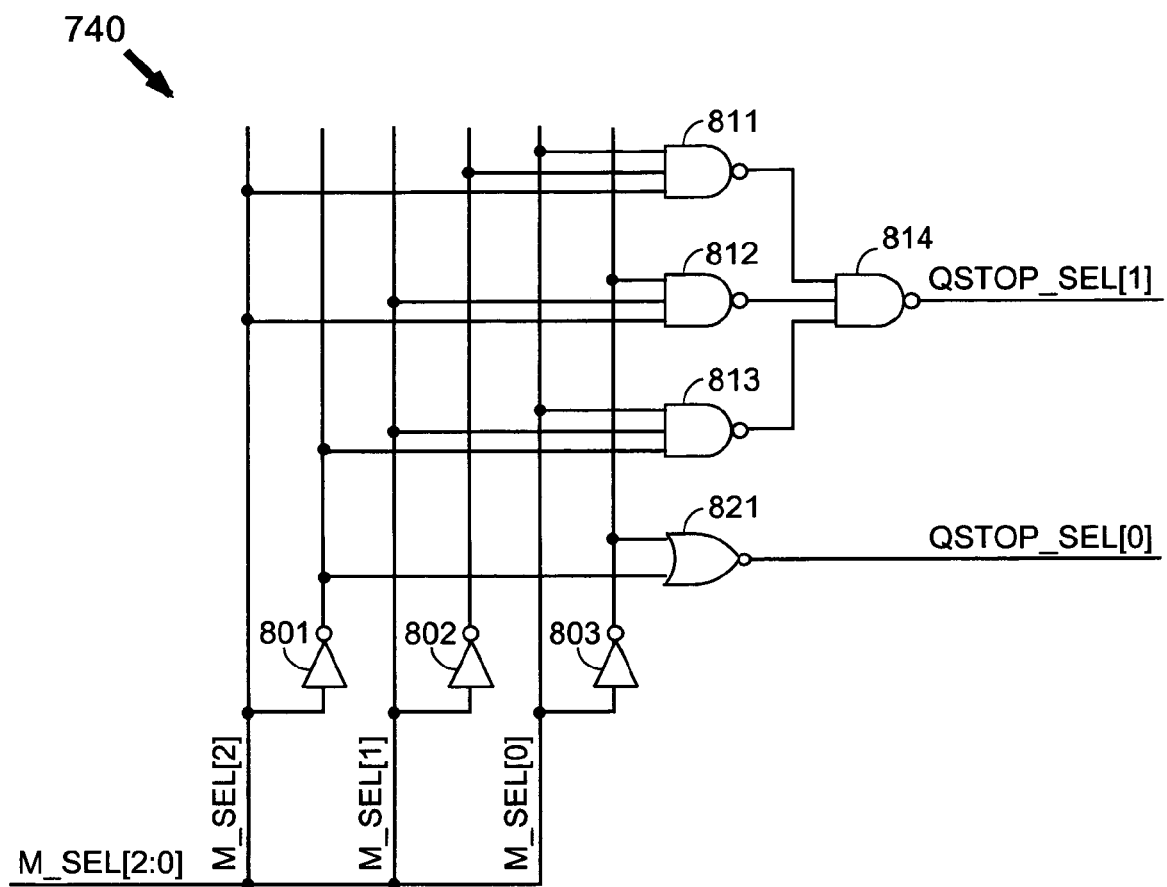
FIG. 8 illustrates an M decoder circuit that can be used, for example, in the output clock generator of FIG. 7.

As shown in FIG. 8, M decoder 740 can be implemented, for example, using inverters 801–803, NAND gates 811–814, and NOR gate 821, coupled together as shown in FIG. 8. Other implementations can also be used. Table 3 shows the values of M_SEL[2:0] and how they are decoded by M decoder 740.

TABLE 3

| M_SEL[2:0] | | | QSTOP_SEL[1:0] | | M |
|---|---|---|---|---|---|
| [2] | [1] | [0] | [1] | [0] | |
| 0 | 0 | 0 | 0 | 0 | 8 |
| 0 | 0 | 1 | 0 | 0 | 1 |
| 0 | 1 | 0 | 0 | 0 | 2 |
| 0 | 1 | 1 | 1 | 0 | 3 |
| 1 | 0 | 0 | 0 | 0 | 4 |
| 1 | 0 | 1 | 1 | 1 | 5 |
| 1 | 1 | 0 | 1 | 0 | 6 |
| 1 | 1 | 1 | 0 | 1 | 7 |

Counter circuit 710 includes three reset flip-flops 712–714 and a "select intermediate points" decoder circuit (SEL_I_P DECODER) 711. Decoder circuit 711 uses the current value in the counter SIP[2:0] and the values M_SEL[2:0] to generate the next values for flip-flops 712–714, as shown in FIG. 7. Table 4 illustrates the succession of binary count values stored in flip-flops 712–714 for each value of M_SEL [2:0]. For clarity, Table 4 also shows which multiplexer 701–704 is selected by M decoder 740 for each value of M_SEL[2:0].

TABLE 4

| M_SEL[2:0] | | | Repeated Binary Count | | |
|---|---|---|---|---|---|
| [2] | [1] | [0] | D[2:0] | M | MUX |
| 0 | 0 | 0 | 0, 1, 2, 3, 4, 5, 6, 7 | 8 | 704 |
| 0 | 0 | 1 | 0 | 1 | 704 |
| 0 | 1 | 0 | 0, 4 | 2 | 704 |
| 0 | 1 | 1 | 0, 2, 4 | 3 | 702 |
| 1 | 0 | 0 | 0, 2, 4, 6 | 4 | 704 |
| 1 | 0 | 1 | 0, 1, 2, 3, 4 | 5 | 701 |
| 1 | 1 | 0 | 0, 1, 2, 3, 4, 5 | 6 | 702 |
| 1 | 1 | 1 | 0, 1, 2, 3, 4, 5, 6 | 7 | 703 |

In the pictured embodiment, the output clock generator 306 uses a synchronized reset signal SYNC_RST, generated by reset circuit 307 (see FIG. 3). Signal SYNC_RST is used in conjunction with various other signals to reset the output clock generator 306. Counter circuit 710 counts the pulses on the output clock signal CLKOUT using the negative edge of signal CLKOUT. Stop decoder 730 decodes the value of SIP[2:0] to detect the last pulse (the "stop point") in a single cycle of the divided clock signal. For example, if M=8, the value of SIP[2:0] associated with the last pulse is 7. If M=1, the value of SIP[2:0] associated with the last pulse is 0. If M=2, 3, or 5, the value of SIP[2:0] associated with the last pulse is 4 (see Table 4). After the last pulse of signal CLKOUT is generated, signal EN1SHOT_B goes low. EN1SHOT_B is an active low signal. When signal EN1SHOT_B is low, the one-shot circuit (i.e., NOR gate 753 and inverters 754–756) is enabled to generate a low pulse on signal RSTPULSE when signal CLKOUT makes the last pulse transition from high to low. The pulse on signal RSTPULSE resets counter circuit 710 and clock generator circuit 720, then releases the two circuits to wait for the next rising edge of the divided clock signal DIVCLK. The next rising edge of signal DIVCLK starts the process over again, generating CLKOUT pulses as dictated by the value M_SEL [2:0].

In order for the one-shot to function properly, the total delay of inverters 754 and 755 must be greater than the delay from the output of inverter 756 (i.e., the inverse of signal CLKOUT) through counter circuit 710 and stop decoder 730 to signal EN1SHOT_B. Therefore, in some embodiments more than two inverters are included on the signal path from the output of inverter 756 to signal DIS1SHOT. However, the number of inversions must be an even number for the embodiment of FIG. 7 to function as described. Because the pulse on signal RSTPULSE is generated when the last pulse of signal CLKOUT goes low, the pulses on signal CLKOUT have a uniform pulse width.

Figure 9:
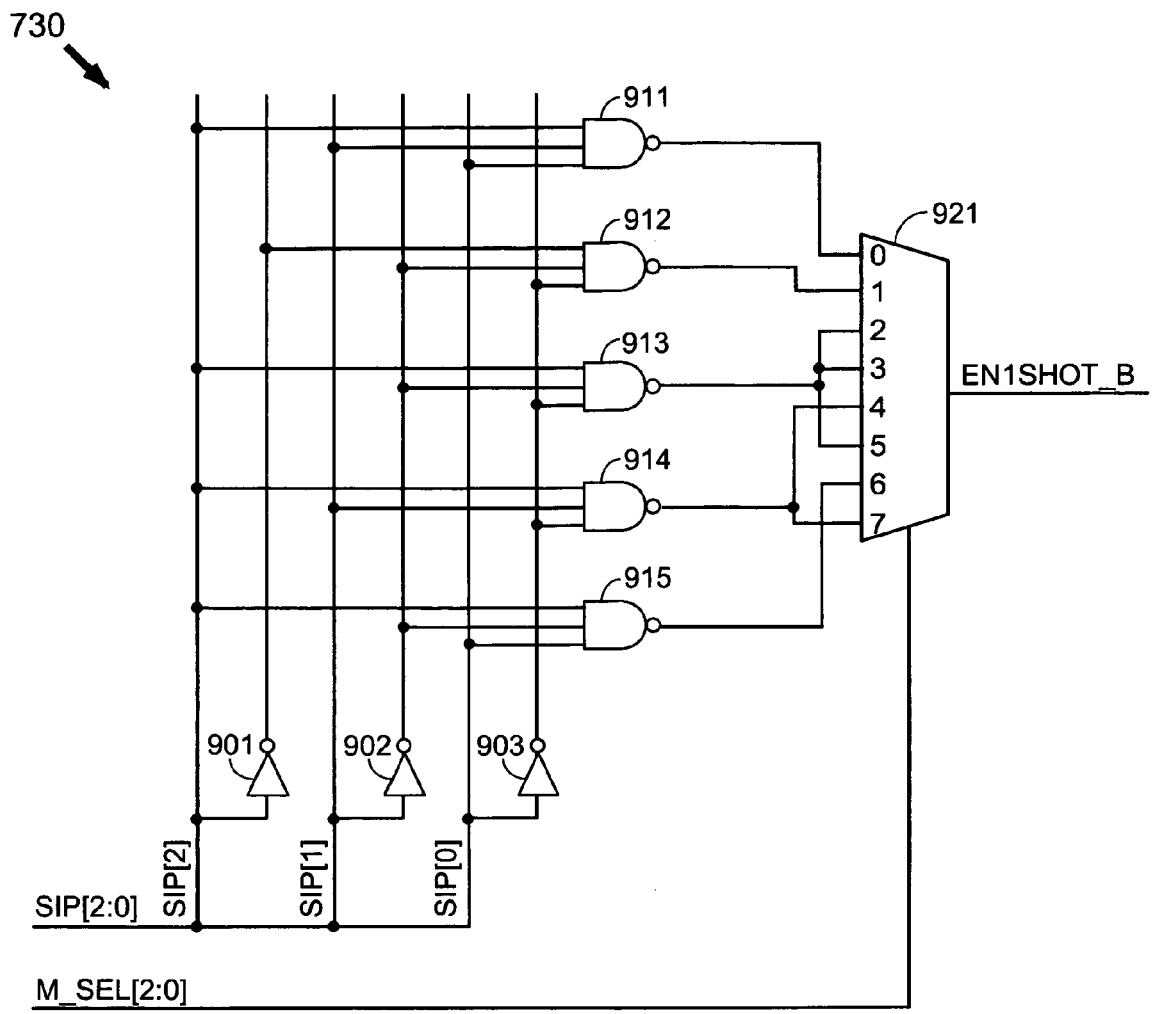
FIG. 9 illustrates an S-END decoder circuit that can be used, for example, in the output clock generator of FIG. 7.

As shown in FIG. 9, stop decoder 730 can be implemented, for example, using inverters 901–903, NAND gates 911–915, and multiplexer 921, coupled together as shown in FIG. 8. Other implementations can also be used. In the pictured embodiment, the stop point for M=8 (M_SEL[2:0] =000) is SIP[2:0]=111, for example. The stop point for M=7 (M_SEL[2:0]=111) is SIP[2:0]=110. The other stop points are easily derived from the circuit illustrated in FIG. 9.

Clearly, each rising edge of signal DIVCLK enables clock generator circuit 720 to generate M pulses on signal CLKOUT. Once the M pulses have been generated, clock generator circuit 720 is reset and then released to wait for the next rising edge of signal DIVCLK. In this way, even if the period of signal CLKOUT does not match M/D perfectly, there is no accumulation of the error over time to cause clock drifting. In other words, every D cycles of input clock signal CLKIN corresponds to M cycles of output clock signal CLKOUT. Further, the first of each M CLKOUT pulses is synchronized with the first of each D CLKIN pulses.

Returning now to FIG. 7, clock generator circuit 720 includes set flip-flop 721, oscillator circuit 722, counter 723, comparator 724, inverter 725, and reset flip-flop 726, coupled together as shown in FIG. 7. Clock generator circuit 720 operates as follows.

When signal DIVCLK goes high, the ground GND value is clocked into set flip-flop 721, driving flip-flop output signal OSC_ENB low and enabling oscillator circuit 722. Oscillator circuit 722 provides an output signal OSC_OUT having a frequency relatively much higher than that of input clock signal DIVCLK. In the pictured embodiment, the frequency of oscillator circuit 722 is the same as the frequency of oscillator circuit 506 (see FIG. 5). Counter 723 is clocked by oscillator circuit 722, and thus counts the oscillations on signal OSC_OUT. The value stored in counter 723 is passed to comparator 724, where it is compared to the value QSTOP[7:0]. When the values match, a high value is provided to reset flip-flop 726. At the next falling edge of signal OSC_OUT, the high output from comparator 724 is clocked into reset flip-flop 726, driving the output clock signal CLKOUT high. Signal CLKOUT goes low again when the value in counter 723 no longer matches the stop value QSTOP[7:0] and signal OSC_OUT goes low, or when signal RSTPULSE goes high.

Any known oscillator circuit can be used to implement oscillator circuit 506 of FIG. 5 and oscillator circuit 722 of FIG. 7. Preferably, the same implementation is used for both oscillator circuits, as this approach creates a high correlation between the oscillators irregardless of external factors such as processing and temperature variations. For example, the well known ring oscillator design (e.g., a loop including an odd number of logic gates, e.g., two inverters and a NAND gate driven by the enable signal) can be used. This embodiment is particularly useful when the DFS circuit is implemented in a PLD, because the oscillator can be implemented using the programmable logic blocks of the PLD. In some embodiments, external oscillators are used.

Any known counter or counters can be used to implement counter 507 of FIG. 5 and/or counter 723 of FIG. 7. For example, the well known ripple counters can be used. In some embodiments, double-edge flip-flops are used to double the count stored in the counter. In some embodiments, one of the counters uses double-edge flip-flops with a first oscillator frequency, while the other counter uses single-edge flip-flops with a second oscillator frequency twice that of the first oscillator frequency.

Any known comparator can be used to implement comparator 724 of FIG. 7. For example, the well known exclusive-NOR (XNOR) implementation can be used, wherein each pair of bits is provided to an XNOR gate, the XNOR gates are combined using NAND gates, and the NAND gates each drive a NOR gate providing the comparator output signal.

In the embodiment of FIG. 7, optional flip-flop 757 is used to provide an output clock signal having a 50 percent duty cycle. The complementary output QB is clocked into the data input terminal D each time signal CLKOUT goes high. Therefore, the output signal CO_DCC has a frequency half that of output signal CLKOUT, i.e., F/2×M/D.

Figure 10:
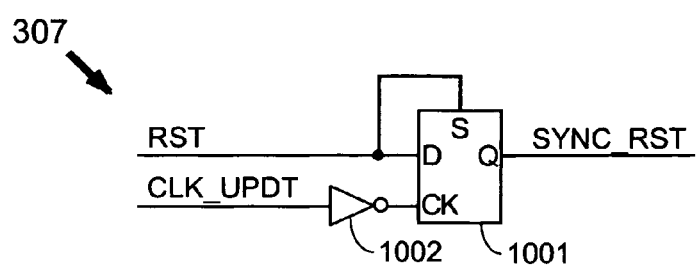
FIG. 10 illustrates a reset circuit that can be used, for example, in the embodiment of FIG. 3.

FIG. 10 illustrates an embodiment of reset circuit 307 that can be used, for example, in the DFS circuit of FIG. 3. The reset circuit of FIG. 10 includes flip-flop 1001 and inverter 1002, coupled together as shown in FIG. 10. In the pictured embodiment, the reset signal for the output clock generator 306 is signal SYNC_RST, provided by the Q output of flip-flop 1001. Whenever reset signal RST is high (active), flip-flop 1001 ensures that signal SYNC_RST is also high. Whenever reset signal RST is low (inactive), flip-flop 1001 clocks in the low value and drives signal SYNC_RST low on the next falling edge of signal CLK_UPDT from counter circuit 304.

Figure 11:
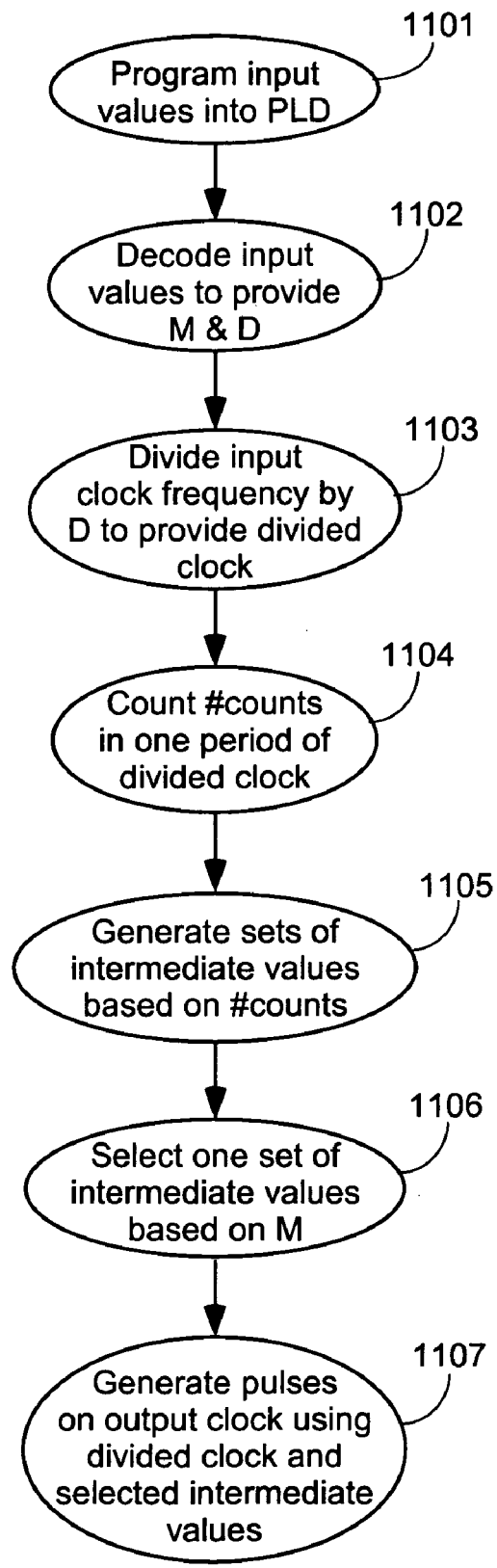
FIG. 11 illustrates the steps of an exemplary method of generating an output clock signal having a frequency of F×M/D times the frequency of an input clock signal, according to an embodiment of the invention.

FIG. 11 illustrates the steps of an exemplary method of generating an output clock signal having a frequency of F×M/D times the frequency of an input clock signal, according to an embodiment of the present invention.

In optional step 1101, in which the DFS circuit is programmed into a PLD, input values are programmed into the PLD. These input values can be, for example, M_S[2:0] and D_S[2:0]. Clearly, these designations and bit widths are purely exemplary. In optional step 1102, the programmed input values are decoded to generate values of M and D such that M and D have no common divisors other than one.

In step 1103, an input clock signal having an input clock frequency of F is divided down to produce a divided clock signal having a frequency of F/D. In step 1104, a number of counts in one period of the divided clock signal is counted.

In step 1105, two or more sets of intermediate values are generated, based on the number of counts counted in step 1104. Each set of intermediate values represents intermediate points within one period of the divided clock signal. In step 1106, one of these sets of intermediate values is selected, based on the value of M.

In step 1107, pulses are generated on an output clock signal at the beginning of each period of the divided clock signal and at intermediate points represented by the selected set of intermediate values. In some embodiments, pulses are generated on the output clock signal at the beginning of each period of the divided clock signal and at each of the intermediate points represented by the selected set of intermediate values. For example, in the embodiment of FIGS. 3–10, this approach is used when M=5, 6, 7, or 8. In some embodiments, pulses are generated on the output clock signal at the beginning of each period of the divided clock signal and at each of the intermediate points represented by a selected subset of intermediate values. For example, in the embodiment of FIGS. 3–10, this approach is used when M=1, 2, 3, or 4. In some embodiments, such as the embodiment shown in FIGS. 3–10, both approaches are used, depending on the value of M.

Those having skill in the relevant arts of the invention will now perceive various modifications and additions that can be made as a result of the disclosure herein. For example, the above text describes the circuits of the invention in the context of programmable logic devices (PLDs) such as FPGAs and CPLDs. However, the circuits of the invention can also be implemented in other integrated circuits, including non-programmable circuits. The circuits of the invention can also be implemented in other electronic systems, for example, in printed circuit boards including discrete devices.

Further, counters, counter circuits, multiplexers, decoders, oscillator circuits, clock dividers, clock divider circuits, inverters, NAND gates, NOR gates, comparators, reset circuits, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A system, comprising:
   a clock divider circuit having an input clock terminal and a clock output terminal;
   a first counter circuit having a clock input terminal coupled to the clock output terminal of the clock divider circuit, a plurality of data output terminals, and a clock output terminal;
   a timing circuit having a plurality of data input terminals coupled to the data output terminals of the first counter circuit, a clock input terminal coupled to the clock output terminal of the first counter circuit, and a plurality of sets of output terminals; and
   an output clock generator having a plurality of input terminals coupled to the sets of output terminals of the timing circuit, a clock input terminal coupled to the clock output terminal of the clock divider circuit, and an output clock terminal.

2. The system of claim 1, wherein the output clock generator comprises:
   a multiplexer circuit having a plurality of sets of data input terminals, each set of data input terminals being coupled to a different one of the sets of output terminals of the timing circuit, and further having a plurality of select input terminals and a plurality of output terminals;
   a second counter circuit having a plurality of output terminals coupled to the select input terminals of the multiplexer circuit, and further having a clock input terminal coupled to the output clock terminal of the output clock generator; and
   a clock generator circuit having an input terminal coupled to the clock output terminal of the clock divider circuit, a plurality of input terminals coupled to the output terminals of the multiplexer circuit, and an output terminal coupled to the output clock terminal of the output clock generator.

3. The system of claim 2, wherein the first counter circuit comprises:
a first oscillator circuit having an input terminal coupled to the clock output terminal of the clock divider circuit and further having an output terminal; and
a first counter having an input terminal coupled to the output terminal of the first oscillator circuit and further having a plurality of data output terminals coupled to the data output terminals of the first counter circuit.

4. The system of claim 3, wherein the clock generator circuit comprises:
a second oscillator circuit having an input terminal coupled to the clock output terminal of the clock divider circuit and further having an output terminal, the second oscillator circuit being implemented to oscillate with the same frequency as the first oscillator circuit;
a second counter having an input terminal coupled to the output terminal of the second oscillator circuit and further having a plurality of data output terminals; and
a comparator having a first set of data input terminals coupled to the output terminals of the multiplexer circuit, a second set of data input terminals coupled to the data output terminals of the second counter, and an output terminal coupled to the output terminal of the clock generator circuit.

5. The system of claim 4, further comprising a flip-flop coupled between the output terminal of the comparator and the output terminal of the clock generator circuit, the flip-flop having a clock input terminal coupled to the output terminal of the second oscillator circuit.

6. The system of claim 1, wherein the first counter circuit comprises means for resetting itself after each R input clock periods, wherein R is an integer.

7. The system of claim 1, wherein the system comprises a programmable logic device (PLD), and the clock divider circuit, the first counter circuit, the timing circuit, and the output clock generator are at least partially implemented using programmable logic of the PLD.

8. The system of claim 7, wherein the PLD is a field programmable gate array (FPGA).

9. A method, comprising:
dividing an input clock signal to provide a divided clock signal having a frequency of F/D (F divided by D), wherein F is a frequency of the input clock signal and D is a positive integer;
counting a number of counts between successive first edges of the divided clock signal;
generating a plurality of sets of intermediate values based on the number of counts, each set of intermediate values representing intermediate points within a period of the divided clock signal;
selecting one of the sets of intermediate values based on a value M, wherein M is a positive integer; and
generating an output clock signal having a frequency of F×M/D (F times M divided by D) by providing an initial pulse on the output clock signal at the beginning of each period of the divided clock signal and providing, during each period of the divided clock signal, a subsequent pulse on the output clock signal at intermediate points represented by the selected set of intermediate values.

10. The method of claim 9, further comprising:
decoding input values to generate M and D such that M and D have no common divisors other than one.

11. The method of claim 9, wherein the intermediate points represented by each set of intermediate values divide the period of the divided clock signal into approximately equal divisions.

12. The method of claim 9, wherein the first edges are rising edges.

13. The method of claim 9, wherein counting the number of counts is repeated every R periods of the input clock signal, wherein R is an integer.

14. The method of claim 9, wherein the steps of the method are performed by a circuit implemented in a programmable logic device (PLD).

15. The method of claim 14, wherein the PLD is a field programmable gate array (FPGA).

16. The method of claim 14, further comprising:
programming input values into the PLD; and
decoding the input values to generate M and D.

17. The method of claim 9, wherein M and D are programmable values.

18. The method of claim 9, wherein providing a subsequent pulse comprises providing a pulse at all of the intermediate points represented by the selected set of intermediate values.

19. The method of claim 9, further comprising selecting a subset of the selected set of intermediate values; and wherein providing a subsequent pulse comprises providing a pulse at each of the intermediate points represented by the selected subset of intermediate values.

20. A system, comprising:
means for dividing an input clock signal to provide a divided clock signal having a frequency of F/D (F divided by D), wherein F is a frequency of the input clock signal and D is a positive integer;
means for counting a number of counts between successive first edges of the divided clock signal;
means for generating a plurality of sets of intermediate values based on the number of counts, each set of intermediate values representing intermediate points within a period of the divided clock signal;
means for selecting one of the sets of intermediate values based on a value M, wherein M is a positive integer; and
means for generating an output clock signal having a frequency of F×M/D (F times M divided by D) by providing an initial pulse on the output clock signal at the beginning of each period of the divided clock signal and providing, during each period of the divided clock signal, a subsequent pulse on the output clock signal at intermediate points represented by the selected set of intermediate values.

* * * * *